(12) United States Patent
Tilton et al.

(10) Patent No.: US 7,159,414 B2
(45) Date of Patent: Jan. 9, 2007

(54) HOTSPOT COLDPLATE SPRAY COOLING SYSTEM

(75) Inventors: Charles L Tilton, Colton, WA (US);
Thomas D Weir, Pullman, WA (US);
Paul A Knight, Spokane, WA (US)

(73) Assignee: Isothermal Systems Research Inc., Liberty Lake, WA (US)

( * ) Notice: Subject to any disclaimer, the term of this patent is extended or adjusted under 35 U.S.C. 154(b) by 299 days.

(21) Appl. No.: 10/786,243

(22) Filed: Feb. 24, 2004

(65) Prior Publication Data

US 2004/0194492 A1    Oct. 7, 2004

Related U.S. Application Data

(63) Continuation-in-part of application No. 10/260,713, filed on Sep. 27, 2002.

(51) Int. Cl.
*F28D 5/00* (2006.01)
(52) U.S. Cl. ......................................... 62/304; 62/259.2
(58) Field of Classification Search ................ 62/259.2, 62/304, 3.2, 3.7, 3.6; 165/80.4; 361/699, 361/700
See application file for complete search history.

(56) References Cited

U.S. PATENT DOCUMENTS

| | | | |
|---|---|---|---|
| 4,352,392 A | 10/1982 | Eastmam | |
| 4,450,472 A | 5/1984 | Tuckerman et al. | |
| 4,567,505 A | 1/1986 | Pease et al. | |
| 5,183,104 A | 2/1993 | Novotny | |
| 5,220,804 A | 6/1993 | Tilton et al. | |
| 5,247,426 A | 9/1993 | Hamburgen et al. | |
| 5,263,536 A | 11/1993 | Hulburd et al. | |
| 5,675,473 A | 10/1997 | McDunn et al. | |
| 5,718,117 A | 2/1998 | McDunn et al. | |
| 5,719,444 A | 2/1998 | Tilton et al. | |
| 5,731,542 A * | 3/1998 | Limper-Brenner et al. | 174/52.4 |
| 5,768,103 A | 6/1998 | Kobrinetz et al. | |
| 5,901,037 A | 5/1999 | Hamilton et al. | |
| 5,907,473 A * | 5/1999 | Przilas et al. | 361/699 |
| 5,924,482 A | 7/1999 | Edwards et al. | |
| 5,943,211 A * | 8/1999 | Havey et al. | 361/699 |
| 5,959,351 A | 9/1999 | Sasaki et al. | |
| 6,108,201 A | 8/2000 | Tilton et al. | |
| 6,205,799 B1 | 3/2001 | Patel et al. | |
| 6,349,554 B1 | 2/2002 | Patel et al. | |
| 6,550,263 B1 | 4/2003 | Patel et al. | |
| 6,571,569 B1 | 6/2003 | Rini et al. | |
| 6,580,610 B1 | 6/2003 | Morris et al. | |
| 6,604,370 B1 | 8/2003 | Bash et al. | |

(Continued)

OTHER PUBLICATIONS

Bash et al, Inkjet Assisted Spray Cooling of Electronics, ASME IPACK03—International Electronics Packaging Technical Conference and Exhibition, Jul. 6-11, 2003, Maui, Hawaii.

(Continued)

*Primary Examiner*—Melvin Jones
(74) *Attorney, Agent, or Firm*—Paul A. Knight

(57) ABSTRACT

The present invention is a coldplate hotspot spray cooling system that cools an electronic component creating a varying amount of heat across its surfaces. Liquid coolant is dispensed upon a spray pin protruding from a base wherein the liquid creates a very high heat absorbing evaporative thin film. The spray pin is located over an area of the chip that produces a large heat flux, typically referred to as a hotspot. The small size and isolation of the spray pin provides the ability to generate very large heat fluxes. Multiple spray pins are possible.

8 Claims, 6 Drawing Sheets

U.S. PATENT DOCUMENTS

| | | |
|---|---|---|
| 6,606,251 B1 | 8/2003 | Kenny, Jr. et al. |
| 6,612,120 B1 | 9/2003 | Patel et al. |
| 6,650,542 B1 | 11/2003 | Chrysler et al. |
| 6,667,548 B1 | 12/2003 | O'Connor et al. |
| 6,678,168 B1 | 1/2004 | Kenny, Jr. et al. |

OTHER PUBLICATIONS

Tilton, Spray Cooling, Doctorial Dissertation—University of Kentucky, Lexington, Kentucky, 1989.

* cited by examiner

HOTSPOT COLDPLATE SPRAY COOLING SYSTEM

STATEMENT REGARDING FEDERALLY SPONSORED RESEARCH OR DEVELOPMENT

This invention was made with Government support under contract # F33615-03-M-2316 awarded by the Air Force Research Laboratory. The Government has certain rights in this invention.

CROSS REFERENCE TO RELATED APPLICATIONS

We hereby claim benefit under Title 35, United States Code, Section 120 of U.S. patent application Ser. No. 10/260,713 filed Sep. 27, 2002 entitled "Thermal Management System for Evaporative Spray Cooling". This application is a continuation-in-part of the Ser. No. 10/260,713 application. The Ser. No. 10/260,713 application is currently pending. The Ser. No. 10/260,713 application is hereby incorporated by reference into this application.

BACKGROUND

1. Field of the Invention

The present invention relates generally to spray cooling thermal management systems and more specifically it relates to a coldplate spray cooling system that provides high heat evaporative cooling of electronic component hotspots.

2. Description of the Related Art

Liquid cooling is well known in the art of cooling electronics. As air cooling heat sinks continue to be pushed to new performance levels, so has their cost, complexity, and weight. Liquid cooing is replacing air cooling and enabling the performance of electronics to grow exponentially.

A significant performance enhancing feature of liquid cooling relates to the possibility of cooling localized high heat flux zones, commonly referred to as hotspots. Electronic components create varying amounts of heat across their surfaces and a varying amount of heat as a function of time. Today's microprocessors, for example, may be constructed on a silicon die roughly 1 cm by 1 cm. As shown by FIG. 2, The die may have multiple zones for different functions. Such zones may be for inputs and outputs (I/Os), level 1 cache, level 2 cache, and the core. The core may be roughly 0.5 cm by 0.5 cm and is where the main computer processing takes place. Although the core may be, but is not limited to, roughly only 25% of the total area of the die, the core creates almost the entire heat generation of the chip and may create a hotspot. Wherein a chip might be rated for an average heat load of 110 watts, with an average heat flux of 110 watts per centimeter squared, the core may generate 100 watts of that heat and have a heat flux of 400 watts per centimeter squared.

There are a number of different liquid cooling system styles. A first style is bare die. This method places a dielectric liquid coolant in direct contact with the die of a component to be cooled. Heat is directly transferred from the component to the fluid. Another style is referred to as coldplate cooling. This method uses a dielectric or non-dielectric cooling fluid contained within a housing. The housing is in direct contact with a component to be cooled and the fluid is indirectly thermally connected. Typically, a thermal interface material is sandwiched between the housing and the component package, but may also be between the housing and the component (no lid). Although bare die cooing is typically more efficient than coldplate cooling, primarily due to reduced thermal resistances between the fluid and the heat generating transistors, coldplate cooling provides a more flexible system capable of being used with standard chip packages. Coldplate cooling also provides the ability to use a wide range of cooling fluids. Both styles of liquid cooling styles may be used with single-phase and two-phase cooling systems.

Single-phase liquid cooling systems, such as U.S. Pat. No. 6,234,240, have a thermal management block containing a pure liquid. The thermal energy of the electronic component is transferred to the cooling liquid by means of sensible heat gains. The heat transfer rate of the system is equal to the heat transfer coefficient of the cooling fluid on the surface to be cooled, multiplied by the contact area, and further multiplied by difference in temperature between the contact surface and the cooling fluid. For low cost cooling system using ambient temperature cooling fluids, it can be easily seen that a heat transfer improvement requires a faster mass flow rate of the coolant, an increase in the heat transfer coefficient, or an increase in contact area. Even by the common single-phase practice of increasing the contact area by adding fins, pins and the like, single-phase thermal management blocks are unlikely to absorb anything above low-to-medium heat fluxes. Although low-to-medium heat fluxes across a multiple square inch contact area may equate to the overall heat generation rate of an electronic component, low-to-medium heat flux single-phase systems are not capable of localized performance required to cool component hotspots.

The preferred method of liquid cooling is two-phase cooling. With these systems, energy is absorbed by the cooling fluid as latent heat gains. Due to the increased energy required for a phase change in comparison to sensible heat gains, two-phase cooling systems offer the ability to provide more compact and higher performance cooling systems than single-phase systems.

An exemplary two-phase cooling method is spray cooling. Spray cooling uses at least one pump for supplying fluid to at least one nozzle that transform the fluid into droplets. These droplets impinge the surface of the component to be cooled and can create a thin coolant film. Energy is transferred from the surface of the component to the thin film. Because the fluid may be dispensed at or near its saturation point, the absorbed heat causes the thin film to turn to vapor. This vapor is then condensed, often by means of a heat exchanger, or condenser, and returned to the pump. A doctoral dissertation researched and authored by Tilton entitled "Spray Cooling" (available through the University of Kentucky library system, 1989), describes the physics behind spray cooling and the creation of thin evaporative films capable of absorbing heat in excess of 800 watts per centimeter squared. U.S. Pat. No. 5,220,804 discloses a wide area spray cooling system utilizing a vapor management protrusion.

Recently, the problem of cooling hotspots has led to new two-phase cooling technologies. One such technology is disclosed by U.S. Pat. No. 6,443,323, describing a method of variably cooling a computer component through the use of incremental sprayers. The incremental sprayers deposit fluid onto each zone at a mass flow rate necessary for complete phase change. Drops are ejected from an orifice in serial. Although this method improves the efficiency of the system, that is in attaining complete phase change of all dispensed fluid, the dispensing method does not provide spray characteristics necessary to create high heat flux thin film evaporative cooling and high performance cooling of hotspots.

Another method of cooling hotspots is two-phase microchannels, such as described by U.S. Pat. No. 4,450,472. Although this method does not use spray cooling, the design does provide the ability to remove heat in the range of 400–1000 watts per square centimeter using water. The system discloses a method of placing a very small microchannel array over a component. Although this method can effectively lower the temperature of the core, due to large pressure drops and resulting size limitations the method does not efficiently address the needs of the other areas of the die. In addition, this method does not efficiently cool multiple hot spots in separate parts of the die, such as multi-core processors.

For the foregoing reasons, there is a need for a liquid cooling solution that effectively cools the one or more hotspots of a computing component. Thus, there is a need for a localized cooling solution capable of large heat fluxes. Also, the high heat flux cooling system must efficiently and reliably cool the other non-high heat flux areas of the chip. The resulting cooling solution would allow significant improvements in processor performance.

BRIEF SUMMARY OF THE INVENTION

In order to solve the problems of the prior art, and to provide a coldplate spray cooling solution capable of efficiently cooling hotspots, the present invention has been developed.

The present invention is a coldplate hotspot spray cooling system that cools an electronic component creating a varying amount of heat across its surfaces. Liquid coolant is dispensed upon a spray pin protruding from a base wherein the liquid creates a very high heat absorbing evaporative thin film. The spray pin is located over an area of the chip that produces a large heat flux, typically referred to as a hotspot. The small size and isolation of the spray pin provides the ability to generate very large heat fluxes. Multiple spray pins are possible.

These and other features, aspects, and advantages of the present invention will become better understood with regard to the following description, and accompanying drawings

BRIEF DESCRIPTION OF THE DRAWINGS

In the course of the detailed description to follow, reference will be made to the attached drawings. These drawings show different aspects of the present invention and, where appropriate, reference numerals illustrating like structures, components, and/or elements in different figures are labeled similarly. It is understood that various combinations of the structures, components, and/or elements other than those specifically shown are contemplated and within the scope of the present invention.

DETAILED DESCRIPTION OF THE PREFERRED EMBODIMENTS

Many of the fastening, connection, manufacturing and other means and components utilized in this invention are widely known and used in the field of the invention are described, and their exact nature or type is not necessary for a person of ordinary skill in the art or science to understand the invention; therefore they will not be discussed in detail.

Applicant hereby incorporates by reference the following U.S. patents: U.S. Pat. No. 5,220,804 for a high heat flux evaporative cooling system; and U.S. Pat. No. 5,860,602 and U.S. Pat. No. 6,016,969, each for a laminated array of pressure swirl atomizers, and U.S. Pat. No. 6,108,201 for a fluid control apparatus and method for spray cooling and U.S. patent application Ser. No. 10/281,391 for an actuated atomizer.

Figure 1:
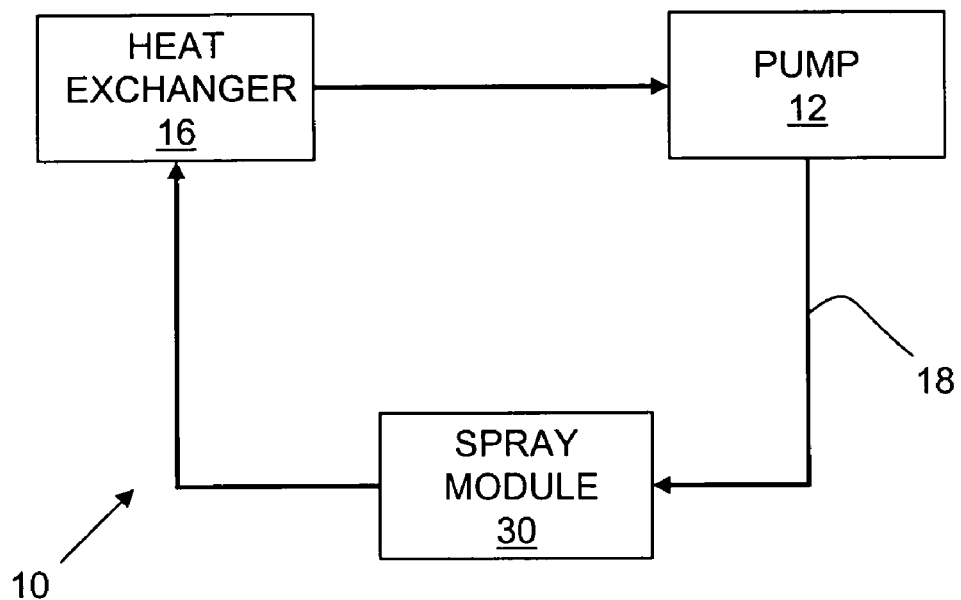
FIG. 1 is a block diagram of a spray cooling system.

Now referring to FIG. 1, a closed loop two-phase spray cooling system 10 is shown. A liquid coolant (not shown) is pressurized by a pump 12. Preferably pump 12 is powered through the use of a direct current motor which creates accurate and precise pressures and flow rates. Pump 12 moves the cooling fluid to a series of system components via a tube system 18. Preferably tube system 18 is flexible and allows for variable three dimensional configurations. Tube system 18 should be made from a coolant compatible material. spray module 30. Spray module 30 is in thermal contact with an electronic component 20 and it transforms the liquid coolant supplied to it into a mixture of liquid and vapor. The vapor is created from the liquid coolant absorbing energy from component 20. The resulting liquid and vapor mixture is then delivered to a heat exchanger 16 wherein the vapor is condensed. The size of heat exchanger 16 can be minimized through the use of a liquid-vapor separator and by only delivering vapor to heat exchanger 16. Liquid can be bypassed directly to pump 12, or to a sub-cooler and then to pump 12. A separator system is disclosed by co-pending application entitled "Hotspot Spray Cooling" also filed on Feb. 24, 2004, and is incorporated herein by this reference. It should be appreciated to one skilled in the art that although only one spray module 30 is shown, more than one may be used within spray cooling system 10.

Figure 2:
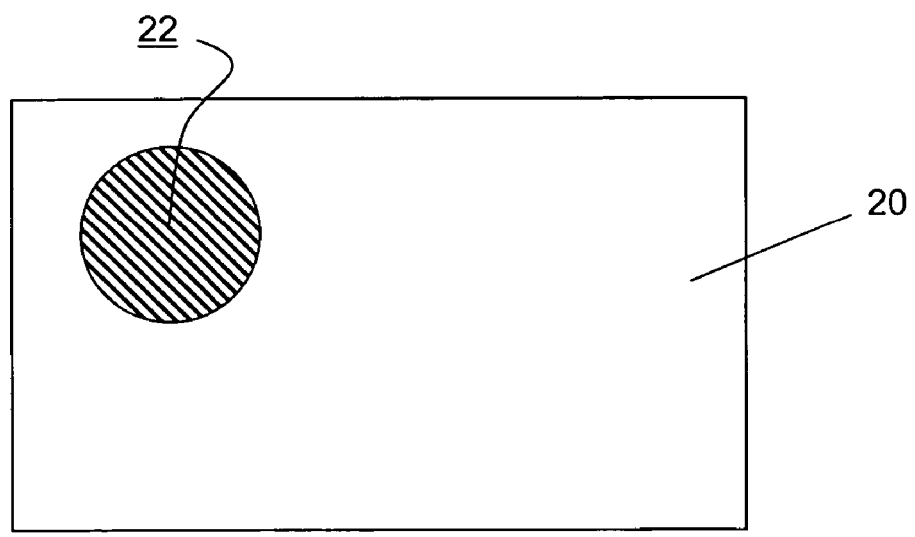
FIG. 2 is a top view of computer chip having a hotspot.

FIG. 2 shows electronic component 20, as typically used in computing applications. The electronic component may be a computer processor, Field Programmable Gate Array (FPGA), Application Specific Integrated Circuit (ASIC), or any other commonly used electronic component. Electronic component 20 is electrically attached to a substrate 24 using any one of a wide range of commonly known interconnect technologies, including: ball grid array, pin grid array, land grid array, and wirebond. The present invention is not limited to any one particular interconnect method.

Electronic component 20, of FIG. 2, is shown as a typical microprocessor. The top surface of component 20 has two zones, each with a unique function, unique power consumption, and thus, a unique heat generation rate. A hotspot 22, where significant computations take place, generates high heat fluxes. The non-hotspot areas of component 20 generate lower heat fluxes. It should be appreciated that an electronic component may have multiple hot spots as areas of execution and floating point calculations may be done in separate locations.

Figure 3:
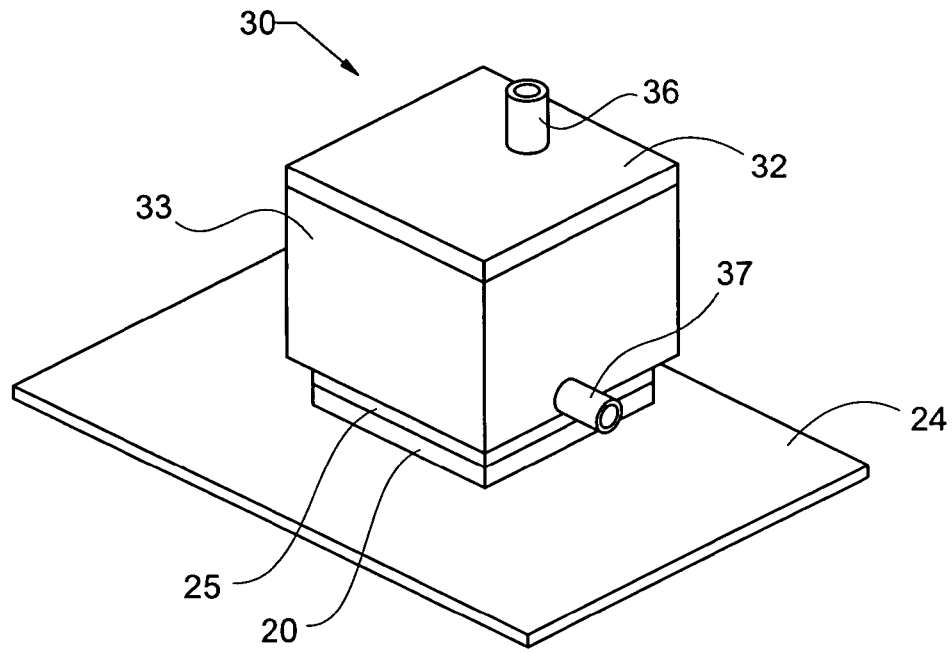
FIG. 3, is a perspective view of a hotspot spray cooling system, according to the present invention, showing a spray module in direct contact with a component to be cooled.
Figure 4:
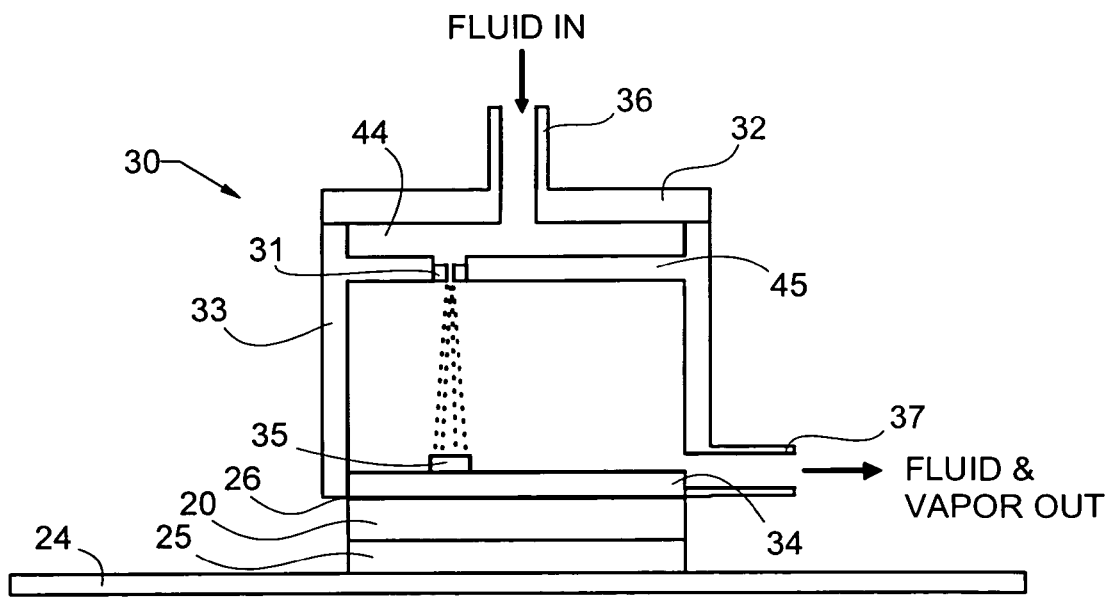
FIG. 4 is a section view of the spray module of FIG. 3, cut through its mid-plane.
Figure 5:
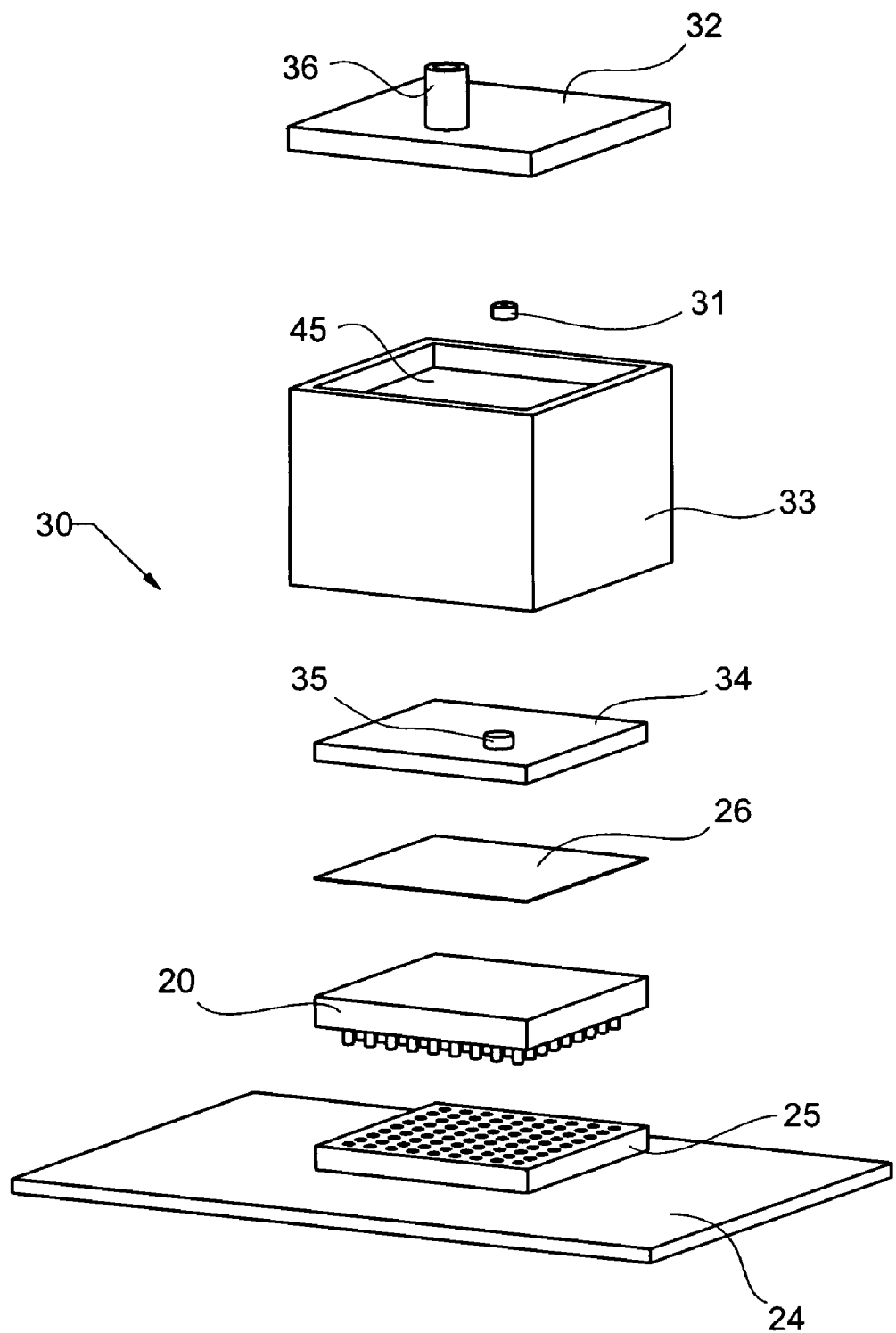
FIG. 5 is a perspective exploded view of the coldplate system of FIG. 3.

FIGS. 3, 4, and 5 show spray module 30 according to the present invention. A substrate 24 may provide a planar surface for which to mount a socket 25. Socket 25 may be any one of a number of widely used commercially available sockets, such as a Zero-Insertion-Socket (ZIF). Socket 25 houses electronic component 20 and maintains electrical contact between electronic component 20 and substrate 24. It should be known to someone skilled in the art that electronic component 20 may be mounted directly to substrate 24 without the use of socket 25.

Attached to the electronic component 20 is spray module 30, which is comprised of a spreader 34, a housing 33, and a cap 32. Spreader 34, housing 33 and cap 32 may be fastened together through the use of sealants and screws, or they may be soldered or brazed together. The present invention is not limited to any particular common manufacturing and joining process. Spray module 30 may be placed in direct contact with electronic component, via the bottom side of spreader 34, or preferably and shown, a commonly known and used thermal interface material 26 may be placed between. Spray module 30 should have a contact force created by either a mechanical fastener or a spring clip. A spring clip retaining method is described by U.S. Pat. No. 6,166,907. As previously described, there are many different styles of socket 25, each with their own retention method. It should be appreciated that spray module 30 may include features necessary for being retained. Because retaining methods have been used with air cooled heatsinks for years they are well understood in the art, and thus will not be described in further detail.

Cap 32 contains at least one inlet 36 which connects to tube system 18. Pressurized cooling fluid enters inlet 36 and moves into a fluid manifold 44 created between cap 32 and a manifold wall 45 of housing 33. Contained by manifold wall 45 is an atomizer 31, preferably a pressure swirl atomizer. Atomizer 31 may be inserted into manifold wall 45, or fabricated within. U.S. Pat. No. 5,860,602 and U.S. Pat. No. 6,016,969 describe the geometry and a method for producing a pressure swirl atomizer. Fluid manifold 44 delivers a supply of high pressure coolant to atomizer 31. It should also be appreciated that fluid manifold 44 may support more than one atomizer 31. Alternatively, the fluid may be brought from inlet 36 directly to atomizer 31 via a direct connection between it and tube system 18.

Atomizer 31 breaks up the supply of coolant into a wide area spray of droplets. Typically, the droplets will have diameters of 10–200 microns and have velocities of 5–50 meters per second. As described by the dissertation by Tilton, optimally the liquid droplets will impinge the cooling surface in a fashion that creates a very high heat flux evaporative thin film. Rather than use wide area high heat flux cooling, as described by U.S. Pat. No. 5,220,804, the present invention creates a localized very high heat flux cooling zone.

Very high heat flux cooling is created through the use of a spray pin 35 inserted or formed into spreader 34. Preferably, spray pin 35 and spreader 34 are made from a highly conductive material such as copper. The location of spray pin 35 is in close proximity to hotspot 22 of the electronic component. The atomizer 31 dispenses liquid onto the top surface of spray pin 35 which creates an evaporative thin-film 40. The energy absorbed by thin-film 40 removes heat from spray pin 35 which removes heat from its local areas. The localized areas around spray pin 35 then absorb thermal energy from hotspot 22.

Figure 6:
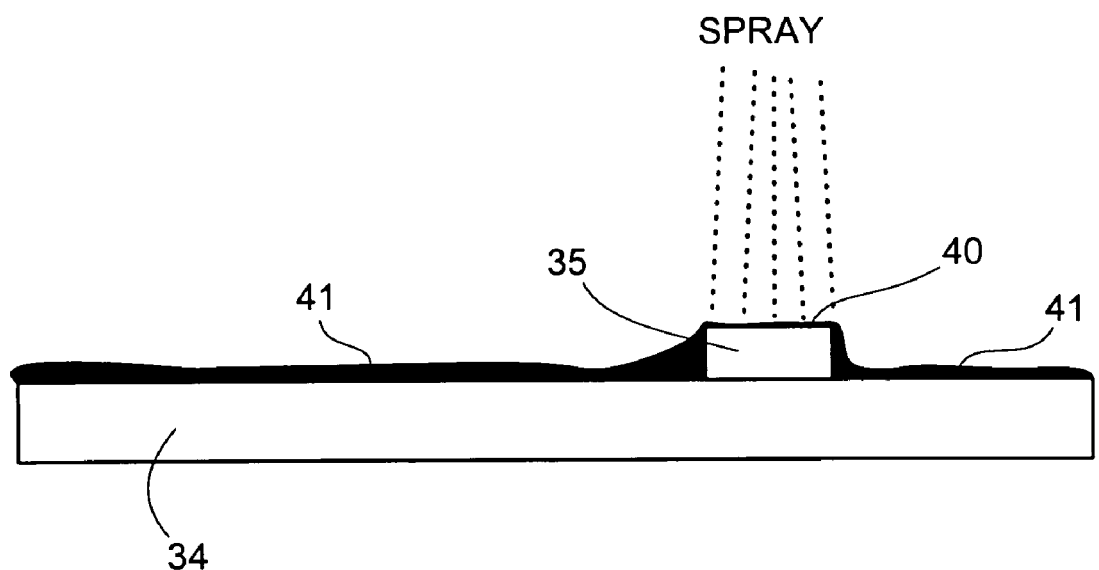
FIG. 6 is a side view a spreader, including a spray pin according to the present invention, and showing liquid flow.

As shown by FIG. 6, excess liquid from spray pin 35 flows onto the top surface of spreader 34 and creates a thick-film 41. Thick-film 41 may be partially or completely vaporized by the top surface of spreader 34 which cools the non-hotspot areas of the electronic component. Excess amounts of thick-film 41 and vapor exits spray module 30 via an exit 37 connected to tube system 18. The excess amounts of thick-film 41 and vapor is then delivered to heat exchanger 16.

The height of spray pin 35 above the top surface of spreader 34 is a design variable. It has been found that a protrusion height of 0.005 inches has created the needed isolation between thin-film 40 and thick-film 41, using water as the cooling fluid. It is predicted that the spray pin 35 may be as tall as 0.050 inches or taller, but excessive height of spray pin 35 creates undesirable conduction losses. The thickness and shape of spreader 34 is also a design variable. It may be planar or have a variable thickness; each potentially providing optimal thermal spreading performance for a particular application.

Wherein the non-hotspot areas of electronic component 20 may have heat fluxes in the range of tens of watts per square centimeter, thin-film 40 on spray pin 35 may produce heat removal rates of several hundreds of watts per square centimeter to several thousand watts per square centimeter. Shown in FIG. 10, testing has provided a correlation between the diameter of spray pin 35 and the heat absorption rate of thin-film 40. Testing was performed with water sub-cooled by 7 to 14 degrees below its saturation point, and atomizer 31 contained a center jet diameter of 0.021 centimeters and was placed above spray pin 35 a distance of 1.65 centimeters. The height of 1.65 centimeters was chosen due to system constraints of the test apparatus. It is predicted that a smaller distance will allow thin-film 40 to absorb even larger heat fluxes. It should be appreciated that spray pin 35 may be sized according to a desired heat flux.

Still referring to FIG. 10, the test data supports the significant functional improvements of the present invention. Spray pin 35 with a diameter of 0.45 centimeters produces a heat flux of 1475 watts per centimeter squared. This equates to a net heat removal rate of 233 watts. The large heat removal rates may be localized over hotspot 22 through the use of spray pin 35. The isolation of spray onto spray pin 35 yield benefits over wide area spraying. Because only one atomizer 31 is required, the system can also be produced at a lower cost than wide area spraying.

Figure 7:
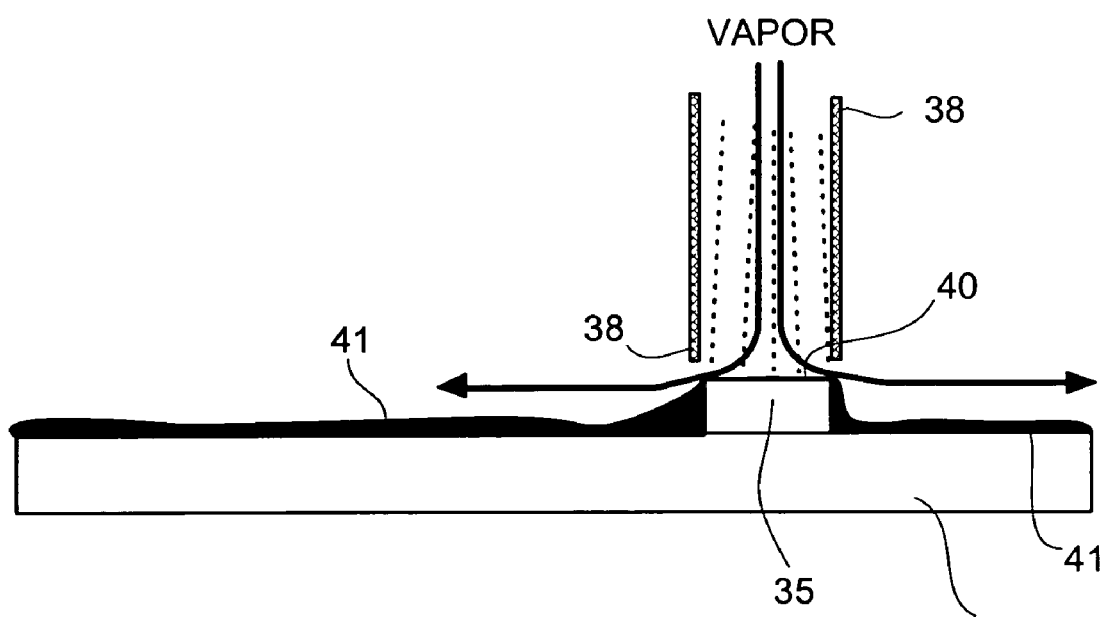
FIG. 7 is a side view of an alternative embodiment of the spreader of FIG. 6, including a vapor management protrusion.

Other embodiments of the present invention are possible. FIG. 7, shows a vapor management protrusion 38 surrounding atomizer 31 which circulates vapor within spray module 30 and over thin-film 40. Vapor management protrusion 38 helps draw liquid off of the spray fin and may result in even higher heat fluxes. It is predicted that vapor management protrusion 38 should be spaced between ½ and ¾ millimeters from thin-film 40 and should allow for vapor recirculation with module 30.

Figure 8:
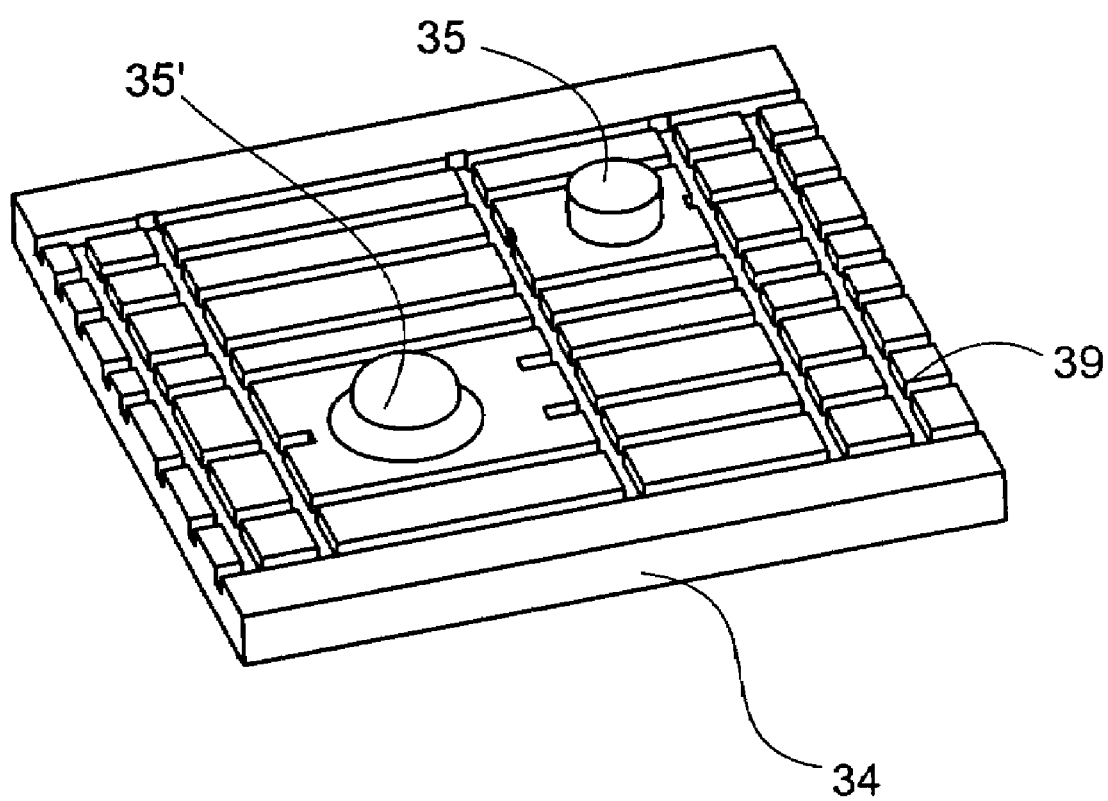
FIG. 8, is a perspective view of an alternative embodiment of the spreader of FIG. 5, showing multiple spray pins of varying shapes and also including area enhancements.
Figure 9:
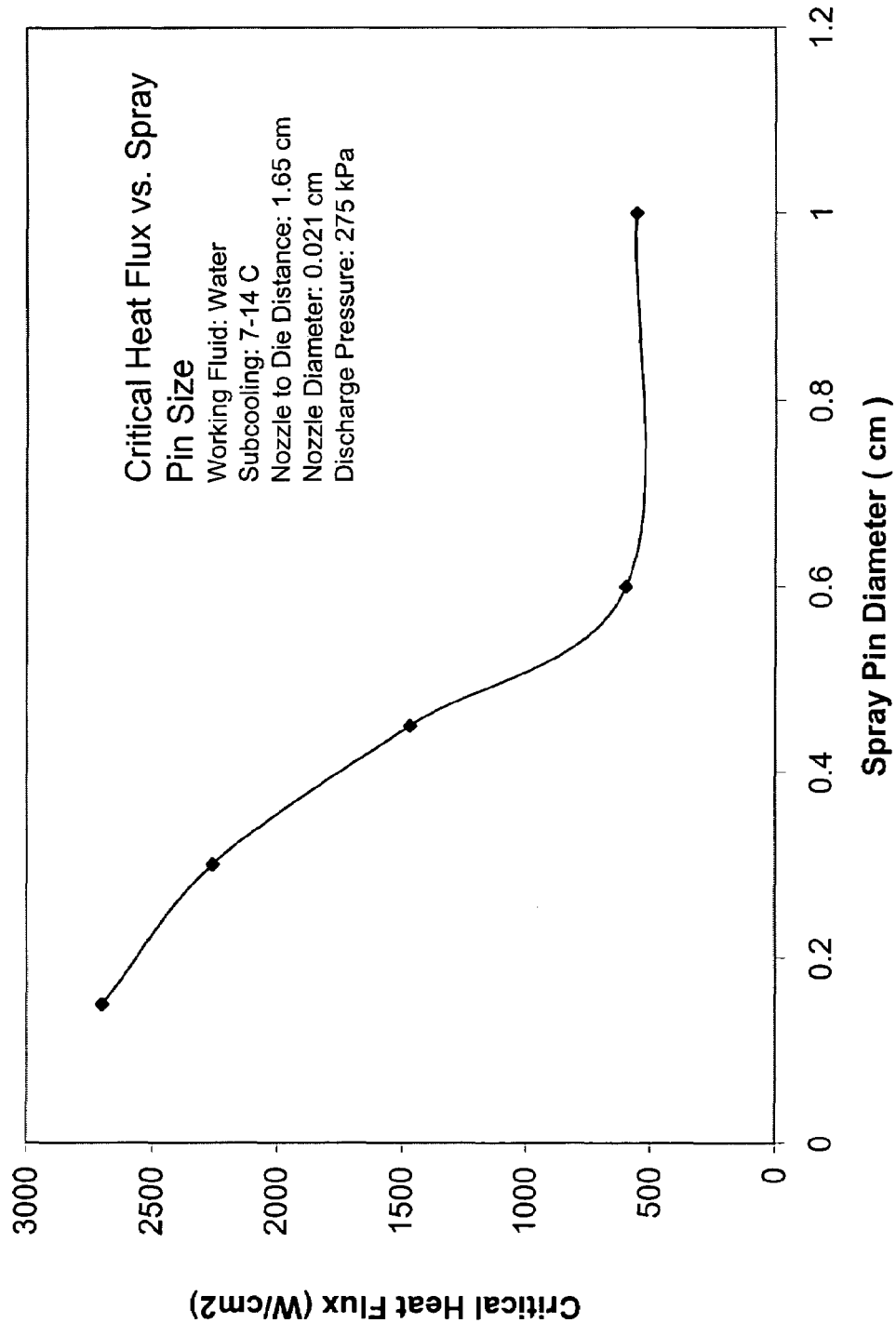
FIG. 9, is a plot showing measured heat fluxes versus spray pin diameters.

In another embodiment shown in FIG. 8, spreader 34 may contain more than one spray pin 35. This allows further control of heat fluxes and the ability to cool multiple hotspots. Also represented in FIG. 8, spray pin 35 is not limited to any particular shape. A spherical version is shown. Other shapes are possible, such as angled cylinders, cubes and tetrahedrals.

FIG. 8 also shows an array of grooves 39 within spreader 34. As previously mentioned for single-phase cooling, increasing the contact area between the cooling fluid and the surface to be cooled increases the heat transfer rate. Thus, grooves 39 increase the heat removal rates over the non-heat flux zones. In addition, they also provide the ability to channel liquid to exit 37. It should also be appreciated that surface enhancements may be placed on the top surface of spray pin 35.

As yet another embodiment within the spirit and scope of the present invention, secondary nozzles may be employed as described by aforementioned co-pending U.S. Patent Application entitled "Hotspot Spray Cooling". The function of the secondary nozzles are to further supply cooling fluid to thick-film 41, as warranted.

While the hot spot cooling system herein described constitute preferred embodiments of the invention, it is to be understood that the invention is not limited to these precise form of assemblies, and that changes may be made therein with out departing from the scope and spirit of the invention. For example, the benefits of the present invention may be applied to a pin constructed from copper deposited directly on a chip surface. The cooling surface would serve as both spreader 34 and as a base to module 30.

ELEMENTS BY REFERENCE NUMMER

| # | NAME |
|---|---|
| 1 | |
| 2 | |
| 3 | |
| 4 | |
| 5 | |
| 6 | |
| 7 | |
| 8 | |
| 9 | |
| 10 | Spray Cooling System |
| 11 | |
| 12 | Pump |
| 13 | |
| 14 | |
| 15 | |
| 16 | Heat Exchanger |
| 17 | |
| 18 | Tube System |
| 19 | |
| 20 | Electronic Component |
| 21 | |
| 22 | Hotspot |
| 23 | |
| 24 | Substrate |
| 25 | Socket |
| 26 | Thermal Interface Material |
| 27 | |
| 28 | |
| 29 | |
| 30 | Spray Module |
| 31 | Atomizer |
| 32 | Cap |
| 33 | Housing |
| 34 | Spreader |
| 35 | Spray Pin |
| 36 | Inlet |
| 37 | Exit |
| 38 | Vapor Management Protrusion |
| 39 | Grooves |
| 40 | Thin-film |
| 41 | Thick-film |
| 42 | |
| 43 | |
| 44 | Manifold |
| 45 | Manifold Wall |

We claim:

1. A spray cooling system comprising:
   an electronic component with a hotspot zone having a high heat flux;
   a spray module having a cavity within, said spray module capable of receiving a supply of liquid coolant;
   a spray fin located generally over said hotspot zone and protruding within said cavity of said spray module
   said spray module having a nozzle located generally over and in a spaced apart relationship to said spray fin, said nozzle for breaking up said supply of liquid coolant into a droplet pattern that creates a thin evaporative coolant film on a top surface of said spray fin; and
   wherein said thin evaporative coolant film is capable of thermally managing said hotspot zone.

2. The spray cooling system of claim 1, wherein said nozzle is an atomizer.

3. The spray cooling system of claim 2, wherein said atomizer is a pressure swirl atomizer.

4. The spray cooling system of claim 1, wherein said top surface of said spray fin includes a surface enhancement.

5. The spray cooling system of claim 1, wherein said supply of liquid coolant is below its saturation temperature prior to entering said nozzle.

6. The spray cooling system of claim 1, wherein said supply of liquid coolant is above its saturation temperature prior to entering said nozzle.

7. The spray cooling system of claim 1, wherein said top surface of said base contains a portion of said supply of liquid coolant that further cools said electronic component.

8. The thermal management system of claim 1, wherein said recipient base includes a plurality of grooves.

* * * * *